United States Patent
Hsu et al.

(10) Patent No.: US 9,310,849 B2
(45) Date of Patent: *Apr. 12, 2016

(54) DUAL-SHAFT SYNCHRONOUS TRANSMISSION DEVICE

(71) Applicant: FIRST DOME CORPORATION, New Taipei (TW)

(72) Inventors: An Szu Hsu, New Taipei (TW); Wang Jui Lee, New Taipei (TW); Chung Yi Lin, New Taipei (TW); Ya Ching Lin, New Taipei (TW)

(73) Assignee: First Dome Corporation, New Taipei (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/462,701

(22) Filed: Aug. 19, 2014

(65) Prior Publication Data

US 2016/0011632 A1    Jan. 14, 2016

(30) Foreign Application Priority Data

Jul. 14, 2014  (TW) .............................. 103124099 A (51) Int. Cl.

| E05D 3/06 | (2006.01) |
|---|---|
| E05D 7/00 | (2006.01) |
| G06F 1/16 | (2006.01) |
| H05K 5/02 | (2006.01) |

(52) U.S. Cl.
CPC ............ *G06F 1/1681* (2013.01); *H05K 5/0226* (2013.01)

(58) Field of Classification Search
CPC ............. E05D 3/12; E05D 3/122; E05D 3/06; E05D 3/10; E05D 11/087; G06F 1/1681; G06F 1/1616; G06F 1/1618; G06F 1/168; E05Y 2900/606; E05Y 2900/602; H04M 1/0216; H04M 1/0222; H04M 1/022; H05K 5/0226; Y10T 16/547; Y10T 16/5837; Y10T 16/53864; Y10T 16/541; Y10T 16/540255; Y10T 16/533; Y10T 16/5938

See application file for complete search history.

(56) References Cited

U.S. PATENT DOCUMENTS

| 6,176,044 | B1 * | 1/2001 | Nixon ................... | E05F 15/614 49/334 |
|---|---|---|---|---|
| 2005/0050686 | A1 * | 3/2005 | Kurokawa ............. | G06F 1/1618 16/354 |
| 2006/0238968 | A1 * | 10/2006 | Maatta ................ | H04M 1/0218 361/679.01 |
| 2011/0289728 | A1 * | 12/2011 | Wang ...................... | E05D 3/122 16/337 |
| 2013/0016489 | A1 * | 1/2013 | Yeh ........................ | G06F 1/1681 361/807 |
| 2013/0318746 | A1 * | 12/2013 | Kuramochi ........... | G06F 1/1681 16/342 |
| 2014/0251045 | A1 * | 9/2014 | Hsu ........................ | G06F 1/1681 74/96 |
| 2014/0360296 | A1 * | 12/2014 | Hsu ........................ | E05D 3/122 74/98 |

(Continued)

*Primary Examiner* — Chuck Mah
(74) *Attorney, Agent, or Firm* — Rosenberg, Klein & Lee (57) ABSTRACT

A dual-shaft synchronous transmission device is applied to an electronic apparatus. The distance between the two shafts of the dual-shaft synchronous transmission device is shortened so that the electronic device can be thinned and lightweight. The dual-shaft synchronous transmission device includes a driver and a reactor respectively disposed on a first shaft and a second shaft and a link unit. Spur gear structures or crown gear structures are respectively disposed on the driver and the reactor. Crown gear structures or spur gear structures are respectively disposed at two ends of the link unit correspondingly engaged with the spur gear structures or crown gear structures of the driver and the reactor. When the first shaft and the driver are rotated, the driver rotates the link unit to drive the reactor and the second shaft to synchronously rotate in a direction reverse to the rotational direction of the driver.

21 Claims, 5 Drawing Sheets

(56) References Cited

U.S. PATENT DOCUMENTS

2014/0373654 A1* 12/2014 Hsu .................. G06F 1/1681
  74/96
2015/0047152 A1* 2/2015 Cheng ................ E05D 3/122
  16/354
2015/0159413 A1* 6/2015 Chen ................. G06F 1/1618
  16/342
2015/0173218 A1* 6/2015 Hsu .................... E05D 3/12
  16/366
2015/0189777 A1* 7/2015 Hsu .................. H05K 5/0226
  16/366

* cited by examiner

DUAL-SHAFT SYNCHRONOUS TRANSMISSION DEVICE

BACKGROUND OF THE INVENTION

1. Field of the Invention

The present invention relates to a dual-shaft synchronous transmission device, and more particularly to a dual-shaft synchronous transmission device in which spur structures and crown gear structures are cooperatively assembled to transmit power so as to synchronously rotate the first and second shafts.

2. Description of the Related Art

There are various electronic apparatuses provided with covers or display screens, such as mobile phones, notebooks, PDA, and electronic books. The covers or display screens are pivotally mounted on the electronic apparatuses via pivot pins or rotary shafts, whereby the covers or display screens can be freely rotated and opened/closed under external force. For example, a prior art discloses a rotary shaft structure and another prior art discloses a pivot pin structure.

In order to operate the display module (such as the screen) and/or the apparatus body module of the electronic apparatus in more operation modes and application ranges, a dual-shaft mechanism is provided between the display module and the apparatus body module, whereby the display module and/or the apparatus body module can be operated in different operation modes by different rotational angles. For example, a prior art discloses a dual-shaft hinge device and U.S. Pat. No. 7,512,426 B2 discloses a mobile communications device with synchronizing hinge.

A conventional synchronous transmission device employs multiple conical (or bevel) gears to transmit power for synchronously rotating the two rotary shafts. As well known by those who are skilled in this field, in application of the conical gears for transmitting power, the conical gears must have a sufficiently long cone distance or face distance so that the engaged gears will not slip during transmission of the power. As a result, with the multiple conical gears, the distance between the two shafts of the dual-shaft synchronous transmission device can be hardly as minified as possible. Therefore, the entire transmission mechanism or structure will have a larger volume to occupy more room. Especially, the transmission mechanism applied to the notebook or a mini-type electronic apparatus fails to meet the requirements of lightweight and thinning of the electronic apparatus. This is not what we expect.

According to the above, many shortcomings exist in the conventional dual-shaft synchronous transmission device. It is therefore tried by the applicant to provide a novel dual-shaft synchronous transmission device, which is redesigned to be different from the conventional device and have widened application range. The dual-shaft synchronous transmission device of the present invention can be easily operated to synchronously rotate the first and second shafts. In addition, the distance between the two shafts of the dual-shaft synchronous transmission device is minimized so as to minify the occupied room or volume of the entire transmission device. Also, the engaged gears of the dual-shaft synchronous transmission device of the present invention will not slip during transmission of power so that the transmission delay can be avoided. In addition, the dual-shaft synchronous transmission device of the present invention is applicable to the mini-type electronic apparatus to meet the requirements of lightweight and thinning of the electronic apparatus.

SUMMARY OF THE INVENTION

It is therefore a primary object of the present invention to provide a dual-shaft synchronous transmission device applicable to an electronic apparatus. The distance between the two shafts of the dual-shaft synchronous transmission device is shortened so that the electronic device can be thinned and lightweight. The dual-shaft synchronous transmission device includes a driver and a reactor respectively disposed on a first shaft and a second shaft and a link unit. Spur gear structures or crown gear structures are respectively disposed on the driver and the reactor. Crown gear structures or spur gear structures are respectively disposed at two ends of the link unit correspondingly engaged with the spur gear structures or crown gear structures of the driver and the reactor. When the first shaft and the driver are rotated, the driver rotates the link unit to drive the reactor and the second shaft to rotate in a direction reverse to the rotational direction of the driver. Accordingly, the first and second shafts can be synchronously rotated in reverse directions.

In the above dual-shaft synchronous transmission device, the synchronous transmission device is disposed between a main fixing plate and a subsidiary fixing plate having identical structures. The main fixing plate and the subsidiary fixing plate are disposed on the first and second shafts. Each of the main fixing plate and the subsidiary fixing plate has a base section for together pivotally connecting with the link unit. The base sections of the main fixing plate and the subsidiary fixing plate are formed with grooves. A lubricant or the like can be filled in the grooves to keep the link unit more smoothly rotated between the base sections.

The present invention can be best understood through the following description and accompanying drawings, wherein:

DETAILED DESCRIPTION OF THE PREFERRED EMBODIMENTS

Figure 1:
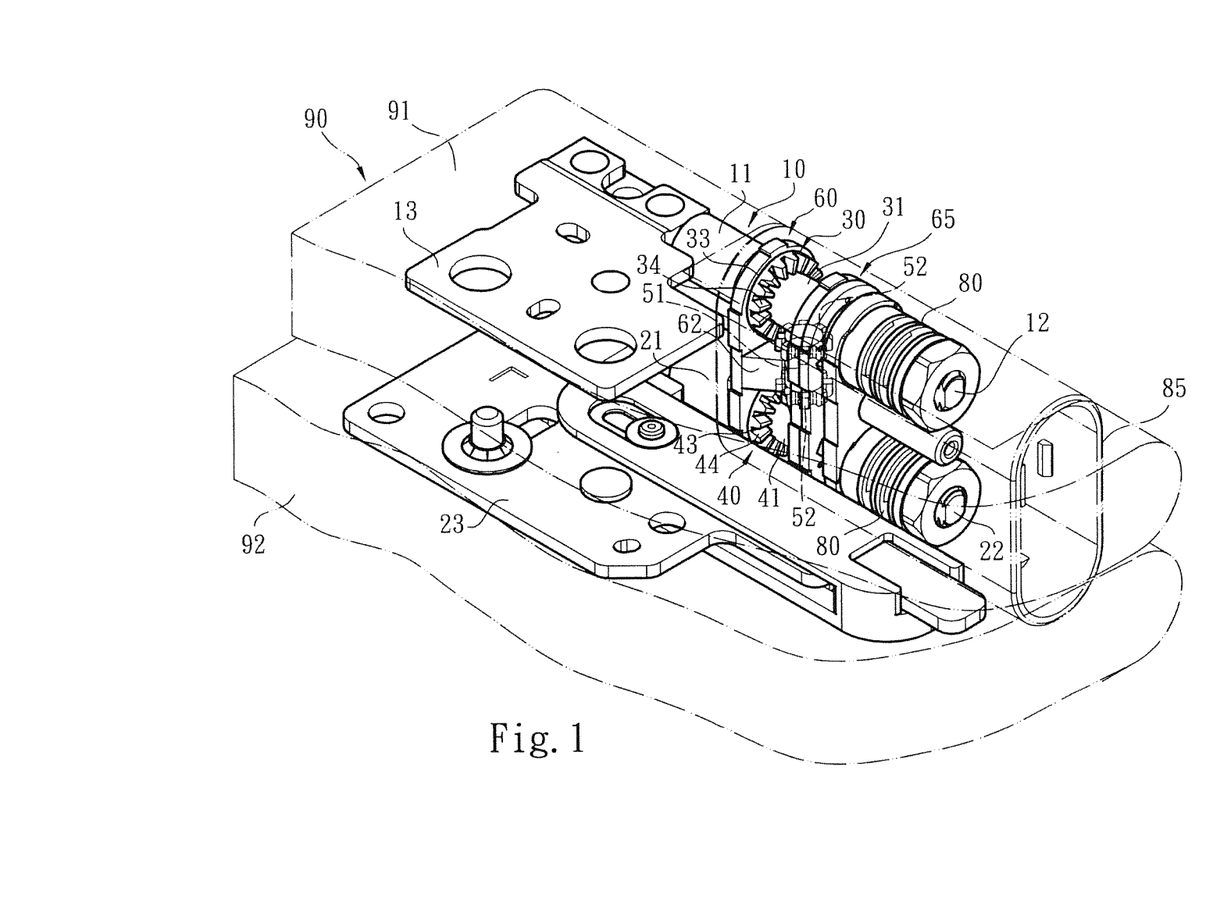
FIG. 1 is a perspective assembled view of a first embodiment of the present invention, in which the phantom lines show that an electronic apparatus is positioned in a closed position and show the relationship between the electronic apparatus and the first and second shafts.
Figure 2:
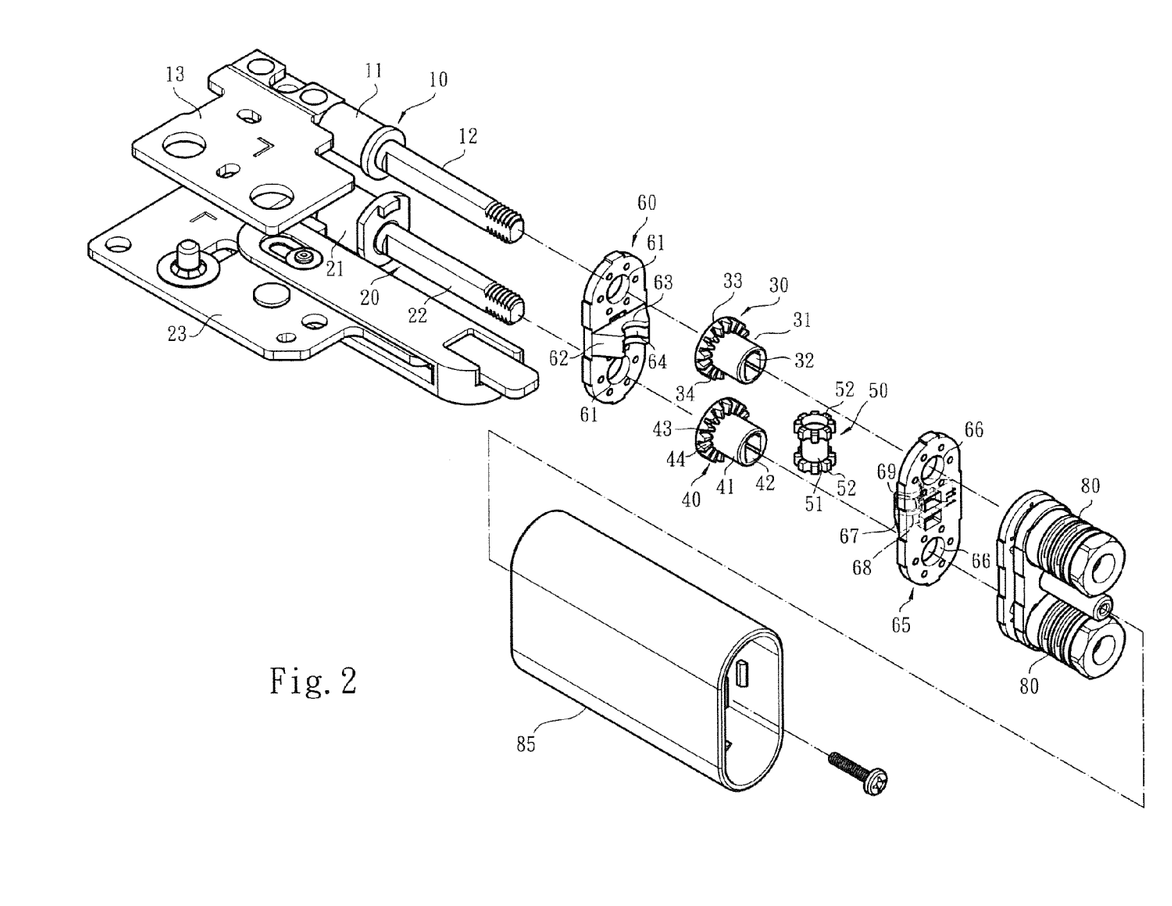
FIG. 2 is a perspective exploded view of the first embodiment of the present invention, showing the structural form of the first and second shafts, the driver, the link unit, the reactor, the main fixing plate, the subsidiary fixing plate and the torque modules.
Figure 3:
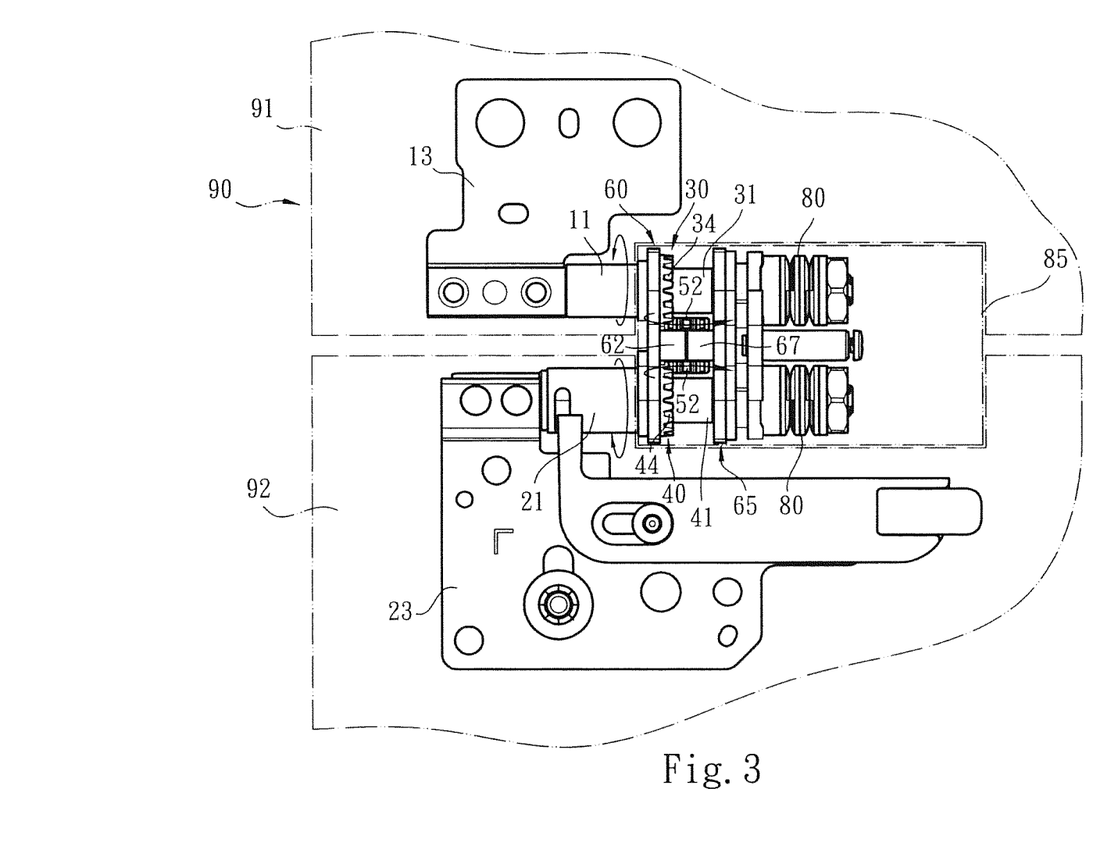
FIG. 3 is a plane view according to FIG. 1, showing that the first shaft and the driver are 90-degree rotated and the link unit drives the reactor and the second shaft to synchronously 90-degree rotate in a reverse direction.

Please refer to FIGS. 1, 2 and 3. The dual-shaft synchronous transmission device of the present invention includes a first shaft 10 and a second shaft 20. Each of the first and second shafts 10, 20 has a fixed section 11, 21 and a pivoted section 12, 22. The fixed sections 11, 21 are assembled with fixing seats 13, 23 to respectively fix the first and second shafts 10, 20 on a display module 91 and an apparatus body module 92 of an electronic apparatus 90 (such as a mobile phone, a computer or the like). The pivoted sections 12, 22 of the first and second shafts 12, 22 are (respectively) assembled with torque modules 80. Accordingly, when the action force applied to the display module 91 or the apparatus body module 92 by a user for rotating the same disappears, the display module 91 and the apparatus body module 92 are immediately located.

As shown in FIGS. 1, 2 and 3, the synchronous transmission device is disposed on the pivoted sections 12, 22 of the first and second shafts. The synchronous transmission device includes a driver 30 disposed on and assembled with the pivoted end 12 of the first shaft and drivable by or rotatable with the first shaft 10, a reactor 40 disposed on and assembled with the pivoted end 22 of the second shaft and drivable by or rotatable with the second shaft 20, and a link unit 50 disposed and connected between the driver 30 and the reactor 40. When the first shaft 10 drives the driver 30 to rotate, the driver 30 drives and rotates the link unit 50. At the same time, the link unit 50 drives the reactor 40 and the second shaft 20 to rotate in a direction reverse to the rotational direction of the driver 30. Accordingly, the first and second shafts 10, 20 can be synchronously rotated in reverse directions.

To speak more specifically, each of the driver 30 and the reactor 40 includes a shaft section 31, 41 in parallel to each other and a shaft hole 32, 42 formed on the shaft section 31, 41. The pivoted sections 12, 22 of the first and second shafts 10, 20 are fixedly fitted in the shaft holes 32, 42 of the driver 30 and the reactor 40. Accordingly, the driver 30 and the first shaft 10 and the reactor 40 and the second shaft 20 are synchronously rotatable. One end of the shaft section 31 of the driver 30 is provided with a disc 33. Also, one end of the shaft section 41 of the reactor 40 is provided with a disc 43. Each of the discs 33, 43 is formed with a crown gear structure 34, 44. The outer diameter of the disc 33 (or 43) is larger than the outer diameter of the shaft section 31 (or 41).

As shown in the drawings, the link unit 50 includes a shaft section 51 normal to the shaft sections 31, 41 of the driver 30 and the reactor 40. The link unit 50 has spur gear structures 52 at two ends of the shaft section 51 corresponding to the crown gear structures 34, 44 of the driver 30 and the reactor 40 for engaging with the crown gear structures 34, 44 of the driver 30 and the reactor 40.

In a preferred embodiment, the synchronous transmission device is disposed between a main fixing plate 60 and a subsidiary fixing plate 65. The main fixing plate 60 and the subsidiary fixing plate 65 can have identical structure so that these two components can be manufactured with the same mold to lower the mold design and development cost. The upper and lower sections of the main fixing plate 60 and the subsidiary fixing plate 65 are respectively formed with perforations 61, 66. The first and second shafts 10, 20 are passed through the perforations 61, 66 to fit the main fixing plate 60 and the subsidiary fixing plate 65 on the first and second shafts 10, 20. Each of the main fixing plate 60 and the subsidiary fixing plate 65 has a mountain-shaped base section 62, 67 for together pivotally connecting with the link unit 50, permitting the link unit 50 to rotate between the base sections 62, 67.

To speak more specifically, each of the base sections 62, 67 of the main fixing plate 60 and the subsidiary fixing plate 65 has a recess 63, 68. The recesses 63, 68 of the base sections 62, 67 of the main fixing plate 60 and the subsidiary fixing plate 65 together form a circular hollow in which the shaft section 51 of the link unit 50 is pivotally fitted. In addition, a groove 64, 69 is formed on each of the recesses 63, 68 of the base sections 62, 67 of the main fixing plate 60 and the subsidiary fixing plate 65. A lubricant or the like can be filled in the grooves 64, 69 to keep the link unit 50 more smoothly rotated between the base sections 62, 67.

In a preferred embodiment, the pivoted sections 12, 22 of the first and second shafts, the main fixing plate 60, the driver 30, the reactor 40, the link unit 50, the subsidiary fixing plate 65 and the torque modules 80 are all mounted in a case 85.

Please refer to FIGS. 1 and 3. When a user operates the display module 91 to drive and rotate the first shaft 10 and the driver 30 from a closed position of FIG. 1 to a 90-degree opened position of FIG. 3, the crown gear structure 34 of the disc 33 of the driver 30 drives and rotates the spur gear structure 52 of the link unit 50. At the same time, the spur gear structure 52 of the link unit 50 is rotated to drive the crown gear structure 44 of the disc 43 of the reactor 40 and the second shaft 20 to synchronously rotate. Therefore, the apparatus body module 92 is also 90-degree rotated and opened. It should be noted that in the case that the display module 91, the first shaft 10 and the driver 30 are 180-degree rotated, the link unit 50 will drive the reactor 40, the second shaft 20 and the apparatus body module 92 to 180-degree rotate.

Figure 4:
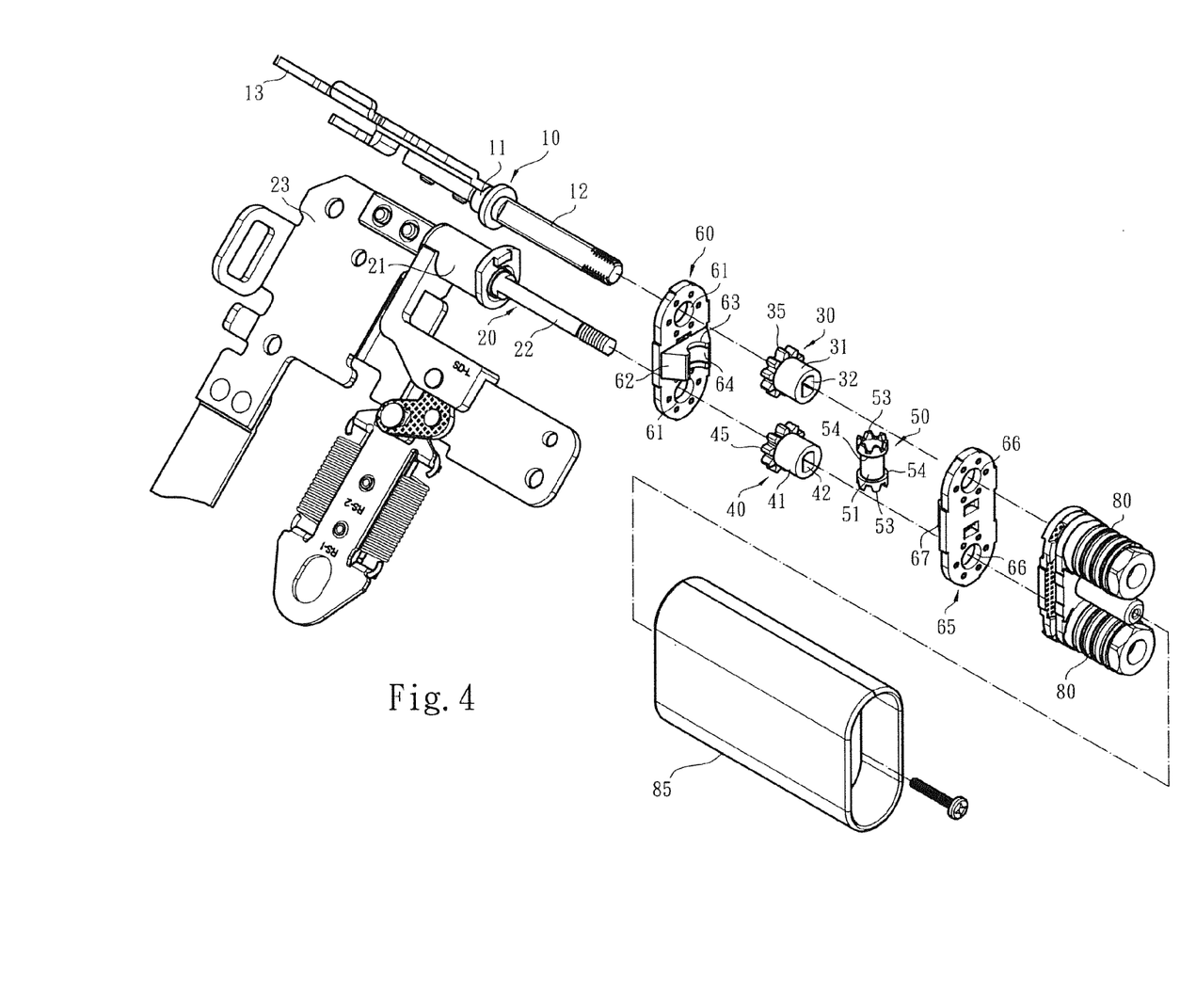
FIG. 4 is a perspective exploded view of a second embodiment of the present invention.
Figure 5:
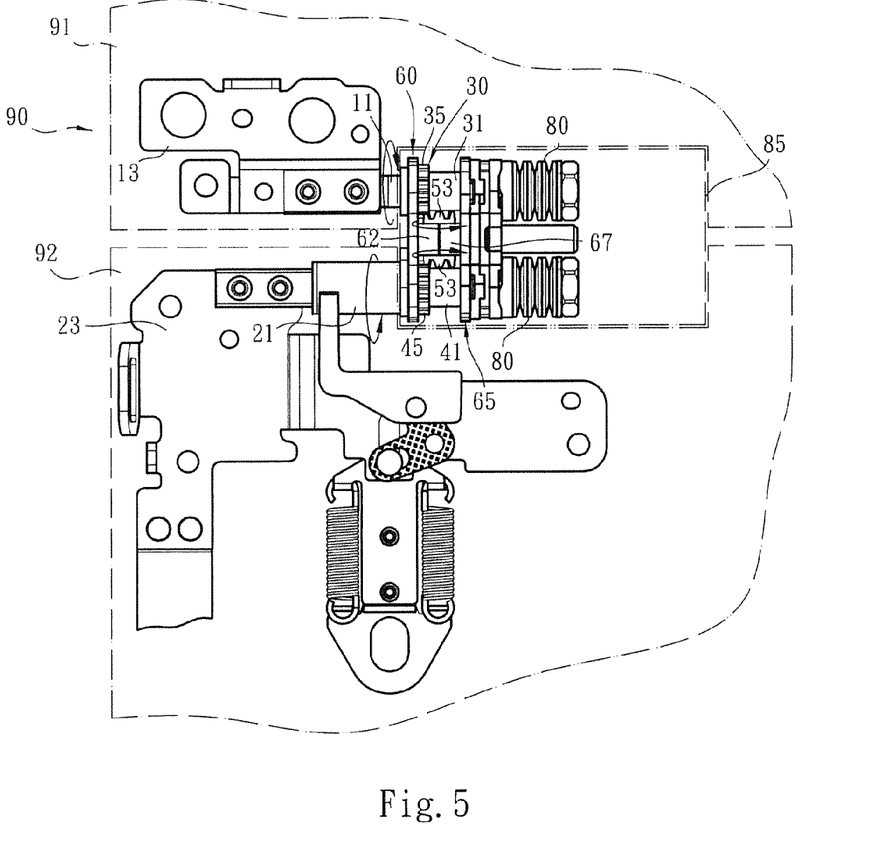
FIG. 5 is a plane view of the second embodiment of the present invention, showing that the first shaft and the driver are 90-degree rotated and the link unit drives the reactor and the second shaft to synchronously 90-degree rotate in a reverse direction, in which the phantom lines show the positional relationship between the electronic apparatus and the first and second shafts.

Please now refer to FIGS. 4 and 5, which show a second embodiment of the present invention. In the second embodiment, a spur crown gear structure 35, 45 is formed at one end of each of the driver 30 and the reactor 40. The link unit 50 has crown gear structures 53 at two ends corresponding to the spur crown gear structures 35, 45 of the driver 30 and the reactor 40 for engaging with the spur crown gear structure 35, 45 of the driver 30 and the reactor 40.

In a modified embodiment, each of two ends of the link unit 50 is formed with a shoulder section 54. The crown gear structures 53 are disposed on the shoulder sections 54. The shoulder section 54 has a width or diameter larger than the width of diameter of the shaft section 51 of the link unit 50.

It should be noted that in comparison with the engagement (or cooperation) length between multiple conical gears, the crown gear structures 34, 44 or spur gear structures 35, 45 of the driver 30 and the reactor 40 are engaged with the spur gear structures 52 or crown gear structures 53 of the link unit 50 with an engagement length only from the tooth root to the tooth crown. In this case, obviously, the distance between the first and second shafts 10, 20 can be as minified as possible.

In comparison with the conventional device, the dual-shaft synchronous transmission device of the present invention can be synchronously and conveniently operated and has the following advantages:

1. In the dual-shaft synchronous transmission device of the present invention, the spur gear structures 35, 45 are disposed on the shaft sections 31, 41 of the driver 30 and the reactor 40. Alternatively, the crown gear structures 34, 44 are disposed on the discs 33, 43. The crown gear structures 53 or the spur gear structures 52 are disposed on the shaft section 51 of the link unit 50 for engaging with the spur gear structures 35, 45 or the crown gear structures 34, 44. The mountain-shaped base sections 62, 67 of the main fixing plate 60 and the subsidiary fixing plate 65 are formed with recesses 63, 68 in which shaft section 51 of the link unit 50 is rotatably disposed. The components of the dual-shaft synchronous transmission device of the present invention are redesigned and are obviously different from the engagement between the conical gears of the conventional device for transmitting the power.

2. In the dual-shaft synchronous transmission device of the present invention, the driver 30, the reactor 40, the link unit 30, the main fixing plate 60 and the subsidiary fixing plate 65 are cooperatively assembled with each other to achieve a transmission effect. In comparison with the conventional device, the present invention is easy to manufacture and assemble. In addition, the distance between the first and second shafts 10, 20 can be minimized to reduce the occupied room or the volume of the entire transmission device. This meets the requirements of lightweight, miniaturization and thinness of electronic apparatus.

In conclusion, the dual-shaft synchronous transmission device of the present invention is designed with a novel structure for effectively transmitting power and is advantageous over the conventional device.

The above embodiments are only used to illustrate the present invention, not intended to limit the scope thereof. Many modifications of the above embodiments can be made without departing from the spirit of the present invention. For example, the spur gears or spur crown gears and the conical (bevel) gear structures can be switched in arrangement. (That is, the conical (bevel) gear structures can be changed to be disposed on the driver 30 or the reactor 40, while the spur gears can be changed to be disposed on the link unit 50).

What is claimed is:

1. A dual-shaft synchronous transmission device, comprising:
   a first shaft having a fixed section and a pivoted section;
   a second shaft having a fixed section and a pivoted section;
   a driver having a shaft section and a shaft hole formed on the shaft section, the pivoted section of the first shaft being fitted in the shaft hole of the driver to mount the driver on the pivoted section of the first shaft, a crown gear structure being disposed on the shaft section of the driver;
   a reactor having a shaft section and a shaft hole formed on the shaft section, the pivoted section of the second shaft being fitted in the shaft hole of the reactor to mount the reactor on the pivoted section of the second shaft, the shaft section of the reactor being parallel to the shaft section of the driver, a crown gear structure being also disposed on the shaft section of the reactor; and
   a link unit including a shaft section normal to the shaft sections of the driver and the reactor, the link unit further including spur gear structures at two ends of the shaft section, the spur gear structures being engaged with the crown gear structures of the driver and the reactor, whereby via the link unit, the first shaft with the driver and the second shaft with the reactor can be synchronously rotated in reverse directions;
   wherein the driver, the reactor and the link unit are disposed between a main fixing plate and a subsidiary fixing plate, the main fixing plate and the subsidiary fixing plate having identical structures, upper and lower sections of the main fixing plate and the subsidiary fixing plate being respectively formed with perforations, the pivoted sections of the first and second shafts being passed through the perforations to fit the main fixing plate and the subsidiary fixing plate on the first and second shafts, each of the main fixing plate and the subsidiary fixing plate having a base section and a recess formed on the base section for together pivotally connecting with the shaft section of the link unit, permitting the link unit to rotate between the base sections.

2. The dual-shaft synchronous transmission device as claimed in claim 1, wherein a disc is disposed at one end of the shaft section of the driver and a disc is disposed at one end of the shaft section of the reactor, the crown gear structures being disposed on the discs, the disc having an outer diameter larger than an outer diameter of the shaft section of the driver.

3. The dual-shaft synchronous transmission device as claimed in claim 2, wherein the recesses of the main fixing plate and the subsidiary fixing plate together form a circular hollow in which the shaft section of the link unit is pivotally fitted, a groove being formed on each of the recesses of the base sections of the main fixing plate and the subsidiary fixing plate.

4. The dual-shaft synchronous transmission device as claimed in claim 2, wherein each of the pivoted sections of the first and second shafts is assembled with a torque module, the pivoted sections of the first and second shafts, the main fixing plate, the driver, the reactor, the link unit, the subsidiary fixing plate and the torque modules being mounted in a case.

5. The dual-shaft synchronous transmission device as claimed in claim 2, wherein the fixed sections of the first and second shafts are assembled with fixing seats to respectively fix the first and second shafts on a display module and an apparatus body module of an electronic apparatus.

6. The dual-shaft synchronous transmission device as claimed in claim 1, wherein the recesses of the main fixing plate and the subsidiary fixing plate together form a circular hollow in which the shaft section of the link unit is pivotally fitted, a groove being formed on each of the recesses of the base sections of the main fixing plate and the subsidiary fixing plate.

7. The dual-shaft synchronous transmission device as claimed in claim 6, wherein the fixed sections of the first and second shafts are assembled with fixing seats to respectively fix the first and second shafts on a display module and an apparatus body module of an electronic apparatus.

8. The dual-shaft synchronous transmission device as claimed in claim 1, wherein each of the pivoted sections of the first and second shafts is assembled with a torque module, the pivoted sections of the first and second shafts, the main fixing plate, the driver, the reactor, the link unit, the subsidiary fixing plate and the torque modules being mounted in a case.

9. The dual-shaft synchronous transmission device as claimed in claim 1, wherein the fixed sections of the first and second shafts are assembled with fixing seats to respectively fix the first and second shafts on a display module and an apparatus body module of an electronic apparatus.

10. A dual-shaft synchronous transmission device, comprising:
    a first shaft having a fixed section and a pivoted section;
    a second shaft having a fixed section and a pivoted section;
    a driver having a shaft section and a shaft hole formed on the shaft section, the pivoted section of the first shaft being fitted in the shaft hole of the driver to mount the driver on the pivoted section of the first shaft, a spur gear structure being disposed on the shaft section of the driver;
    a reactor having a shaft section and a shaft hole formed on the shaft section, the pivoted section of the second shaft being fitted in the shaft hole of the reactor to mount the reactor on the pivoted section of the second shaft, the shaft section of the reactor being parallel to the shaft section of the driver, a spur gear structure being also disposed on the shaft section of the reactor; and
    a link unit including a shaft section normal to the shaft sections of the driver and the reactor, the link unit further including crown gear structures at two ends of the shaft section, the crown gear structures being engaged with the spur gear structures of the driver and the reactor, whereby via the link unit, the first shaft with the driver and the second shaft with the reactor can be synchronously rotated in reverse directions;
    wherein the driver, the reactor and the link unit are disposed between a main fixing plate and a subsidiary fixing plate, the main fixing plate and the subsidiary fixing plate having identical structures, upper and lower sections of the main fixing plate and the subsidiary fixing plate being respectively formed with perforations, the pivoted sections of the first and second shafts being passed through the perforations to fit the main fixing plate and the subsidiary fixing plate on the first and second shafts, each of the main fixing plate and the subsidiary fixing plate having a base section and a recess formed on the base section for together pivotally connecting with the shaft section of the link unit, permitting the link unit to rotate between the base sections.

11. The dual-shaft synchronous transmission device as claimed in claim 10, wherein the recesses of the main fixing plate and the subsidiary fixing plate together form a circular hollow in which the shaft section of the link unit is pivotally fitted, a groove being formed on each of the recesses of the base sections of the main fixing plate and the subsidiary fixing plate.

12. The dual-shaft synchronous transmission device as claimed in claim 11, wherein each of two ends of the link unit is formed with a shoulder section, the crown gear structures being disposed on the shoulder sections, the shoulder section having a width larger than a width of the shaft section of the link unit.

13. The dual-shaft synchronous transmission device as claimed in claim 11, wherein each of the pivoted sections of the first and second shafts is assembled with a torque module, the pivoted sections of the first and second shafts, the main fixing plate, the driver, the reactor, the link unit, the subsidiary fixing plate and the torque modules being mounted in a case.

14. The dual-shaft synchronous transmission device as claimed in claim 11, wherein the fixed sections of the first and second shafts are assembled with fixing seats to respectively fix the first and second shafts on a display module and an apparatus body module of an electronic apparatus.

15. The dual-shaft synchronous transmission device as claimed in claim 10, wherein each of two ends of the link unit is formed with a shoulder section, the crown gear structures being disposed on the shoulder sections, the shoulder section having a width larger than a width of the shaft section of the link unit.

16. The dual-shaft synchronous transmission device as claimed in claim 15, wherein each of the pivoted sections of the first and second shafts is assembled with a torque module, the pivoted sections of the first and second shafts, the main fixing plate, the driver, the reactor, the link unit, the subsidiary fixing plate and the torque modules being mounted in a case.

17. The dual-shaft synchronous transmission device as claimed in claim 16, wherein the fixed sections of the first and second shafts are assembled with fixing seats to respectively fix the first and second shafts on a display module and an apparatus body module of an electronic apparatus.

18. The dual-shaft synchronous transmission device as claimed in claim 15, wherein the fixed sections of the first and second shafts are assembled with fixing seats to respectively fix the first and second shafts on a display module and an apparatus body module of an electronic apparatus.

19. The dual-shaft synchronous transmission device as claimed in claim 10, wherein each of the pivoted sections of the first and second shafts is assembled with a torque module, the pivoted sections of the first and second shafts, the main fixing plate, the driver, the reactor, the link unit, the subsidiary fixing plate and the torque modules being mounted in a case.

20. The dual-shaft synchronous transmission device as claimed in claim 19, wherein the fixed sections of the first and second shafts are assembled with fixing seats to respectively fix the first and second shafts on a display module and an apparatus body module of an electronic apparatus.

21. The dual-shaft synchronous transmission device as claimed in claim 10, wherein the fixed sections of the first and second shafts are assembled with fixing seats to respectively fix the first and second shafts on a display module and an apparatus body module of an electronic apparatus.

* * * * *